United States Patent
Lee et al.

(10) Patent No.: US 11,531,584 B2
(45) Date of Patent: Dec. 20, 2022

(54) MEMORY DEVICE AND TEST OPERATION THEREOF

(71) Applicant: SK hynix Inc., Gyeonggi-do (KR)

(72) Inventors: Seong Ju Lee, Gyeonggi-do (KR); Joon Hong Park, Gyeonggi-do (KR); Young Mok Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 81 days.

(21) Appl. No.: 17/137,699

(22) Filed: Dec. 30, 2020

(65) Prior Publication Data

US 2021/0279129 A1    Sep. 9, 2021

(30) Foreign Application Priority Data

Mar. 6, 2020   (KR) .................. 10-2020-0028396

(51) Int. Cl.
   *G06F 11/10*    (2006.01)
(52) U.S. Cl.
   CPC ...... *G06F 11/1044* (2013.01); *G06F 2201/86* (2013.01)
(58) Field of Classification Search
   None
   See application file for complete search history.

(56) References Cited

U.S. PATENT DOCUMENTS

| | | | | |
|---|---|---|---|---|
| 8,301,941 B2* | 10/2012 | Bodrozic | ......... | G01R 31/31716 714/743 |
| 9,423,456 B2 | 8/2016 | Kim | | |
| 2002/0041532 A1* | 4/2002 | Watanabe | ............ | G11C 7/1006 365/219 |
| 2006/0184848 A1* | 8/2006 | Serizawa | ........... | G11C 29/4401 714/727 |
| 2011/0121294 A1* | 5/2011 | Koyama | ................ | G11C 29/48 257/E23.01 |
| 2012/0266033 A1* | 10/2012 | Gold | ...................... | G11C 29/02 714/E11.02 |
| 2018/0108428 A1* | 4/2018 | Park | ...................... | G11C 29/028 |
| 2020/0005885 A1* | 1/2020 | Mohr | ...................... | G11C 29/18 |

FOREIGN PATENT DOCUMENTS

| | | |
|---|---|---|
| KR | 10-2013-0046888 | 5/2013 |
| KR | 10-2015-0005297 | 1/2015 |
| KR | 10-2015-0025801 | 3/2015 |
| KR | 10-2019-0033410 | 3/2019 |

* cited by examiner

*Primary Examiner* — Cynthia Britt
*Assistant Examiner* — Matthew W Wahlin
(74) *Attorney, Agent, or Firm* — IP&T Group LLP

(57) ABSTRACT

A memory device includes a first comparison circuit suitable for comparing read data read from a plurality of memory cells with write data written in the memory cells and outputting a comparison result, a path selection circuit suitable for transferring selected data selected among the read data and test data as read path data based on the comparison result of the first comparison circuit, and an output data alignment circuit suitable for converting the read path data into serial data to output the serial data as output data.

17 Claims, 7 Drawing Sheets

MEMORY DEVICE AND TEST OPERATION THEREOF

CROSS-REFERENCE TO RELATED APPLICATIONS

The present application claims priority to Korean Patent Application No. 10-2020-0028396, filed on Mar. 6, 2020, which is incorporated herein by reference in its entirety.

BACKGROUND

1. Field

Various embodiments of the present invention relate to a memory device and a test method of the memory device and, more particularly, to a memory device that performs a test operation according to diverse test operation modes, and a method for performing a test operation in the memory device.

2. Description of the Related Art

With the rapid development of semiconductor memory technology, a high level of integration and performance is demanded in packaging semiconductor memory devices. To cope with this demand, researchers and the industry are developing diverse technologies related to a three-dimensional structure in which a plurality of semiconductor memory chips are vertically stacked, rather than a two-dimensional structure in which semiconductor memory chips are planarly disposed on a printed circuit board (PCB) using wires or bumps.

Furthermore, as the operation rates of semiconductor memory devices increase, a semiconductor memory system of a System-In-Package (SIP) form in which a memory controller, such as a Central Processing Unit (CPU) or a Graphic Processing Unit (GPU), and a semiconductor memory device are integrated into one package is widely used. Since the pads of a semiconductor memory device of the stacked structure or the SIP structure are not exposed to the outside, it is difficult to perform a direct test by using a pin of test equipment.

Therefore, the semiconductor memory device may be provided with an additional pad for testing. Inevitably, the number of the test pads of an integrated and miniaturized semiconductor memory device may be limited, and it is required to develop a technology capable of testing a semiconductor memory device with the limited number of test pads.

SUMMARY

Embodiments of the present invention are directed to a memory device capable of performing a test operation on a selected data path through diverse test operation modes, and a test operation method thereof.

In accordance with an embodiment of the present invention, a memory device includes: a first comparison circuit suitable for comparing read data read from a plurality of memory cells with write data written in the memory cells and outputting a comparison result; a path selection circuit suitable for transferring selected data selected among the read data and test data as read path data based on the comparison result of the first comparison circuit; and an output data alignment circuit suitable for converting the read path data into serial data and outputting the serial data as output data.

In accordance with another embodiment of the present invention, a method for operating a memory device includes: converting parallel read data that are read from a plurality of memory cells into serial data to be provided to an input/output pad, converting the serial data feeding back from the input/output pad back into parallel data, and writing the parallel data as write data in the memory cells; comparing the read data and the written data with each other to determine whether a first comparison result is a pass or a failure; and converting test data into the serial data instead of the read data and comparing the test data and the parallel data with each other to determine whether a second comparison result is a pass or a failure, when the first comparison result is determined as the failure.

In accordance with yet another embodiment of the present invention, a method for operating a memory device includes: feeding back read data that are read in parallel from a plurality of memory cells through an input/output pad and converting the fed-back data into parallel data; and comparing the parallel data with each other to determine whether a comparison result is a pass or a failure.

In accordance with yet another embodiment of the present invention, a memory device includes: a memory core configured to store write data and provide read data; a path selector configured to provide test data; a first loop-back path configured to loop the test data, which is transferred from the path selector to an input/output (IO) pad, back to the path selector as first looped-back data; a second loop-back path configured to loop the read data, which is transferred from the memory core to the path selector, back to the memory core as second looped-back data; and a first detector configured to detect a defect of a path between the path selector and the IO pad by comparing the test data with the first looped-back data and to detect a defect of a path between the memory core and the path selector by comparing the read data with the second looped-back data.

These and other features and advantages of the present invention will become apparent to those with ordinary skill in the art to which the present invention belongs to or pertains from the following figures and detailed description.

DETAILED DESCRIPTION

Figure 1:
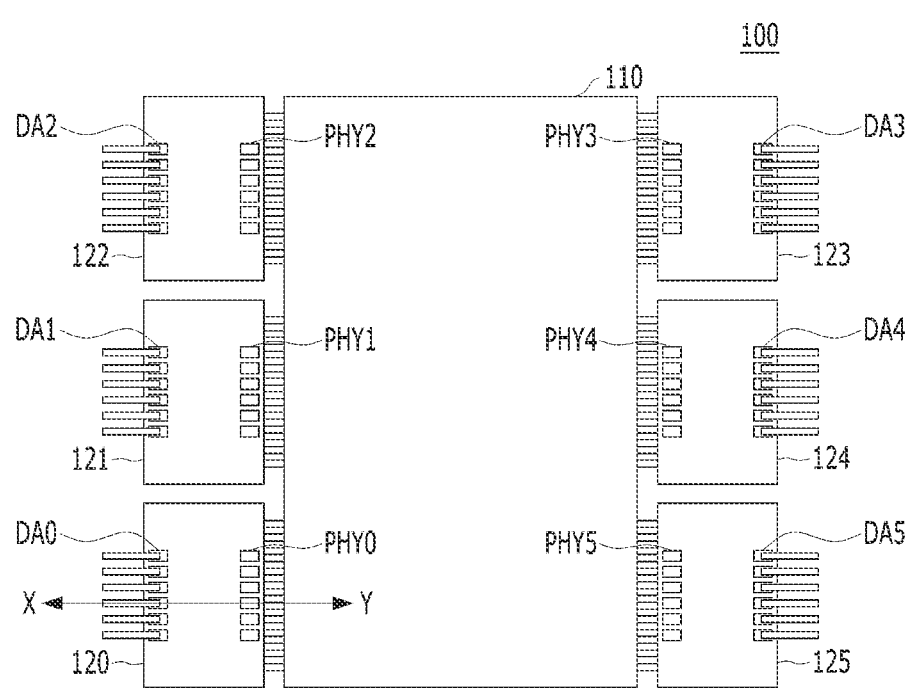
FIG. 1 is a plan view illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

When a first element is referred to as being "over" a second element, it not only refers to a case where the first element is formed directly on the second element but also a case where a third element exists between the first element and the second element. When a first element is referred to as being "on" a second element, it refers to a case where the first element is formed directly on the second layer or the substrate.

It should be understood that the drawings are simplified schematic illustrations of the described devices and may not include well known details for avoiding obscuring the features of the invention. It should also be noted that features present in one embodiment may be used with one or more features of another embodiment without departing from the scope of the invention.

It is further noted, that in the various drawings, like reference numbers designate like elements.

FIG. 1 is a plan view illustrating a memory system in accordance with an embodiment of the present invention.

As shown in FIG. 1, the memory system 100 may have a System-In-Package (SIP) structure. The memory system 100 may include a controller 110 and a plurality of memory devices 120 to 125.

The controller 110 may include a Central Processing Unit (CPU), a Graphic Processing Unit (GPU), a Digital Signal Processor (DSP), an Application Processor (AP), and a memory controller chip, and the like. Diverse types of processing units may be included in the controller 110 in the form of a System on Chip (SoC). In other words, the controller 110 may represent one chip in which diverse systems are integrated.

Each of the memory devices 120 to 125 may include a plurality of integrated circuit chips. The integrated circuit chips may be stacked on one other to be electrically connected via a through silicon via (TSV). That is, the memory devices 120 to 125 may be formed in the form of a high bandwidth memory (HBM) whose bandwidth is increased by increasing the number of input/output units.

However, the present invention is not limited thereto, and the memory devices 120 to 125 may be not only volatile memory devices, such as Dynamic Random Access Memory (DRAM), but also nonvolatile memory devices, such as a flash memory device, a Phase Change Random Access Memory (PCRAM), a Resistive Random Access Memory (ReRAM), a Ferroelectric Random Access Memory (FeRAM), a Magnetic Random Access Memory (MRAM), a Spin Transfer Torque Random Access Memory (STTRAM), or the like. Alternatively, the memory devices 120 to 125 may be formed of a combination of two or more of the volatile memory devices and the non-volatile memory devices.

Figure 2:
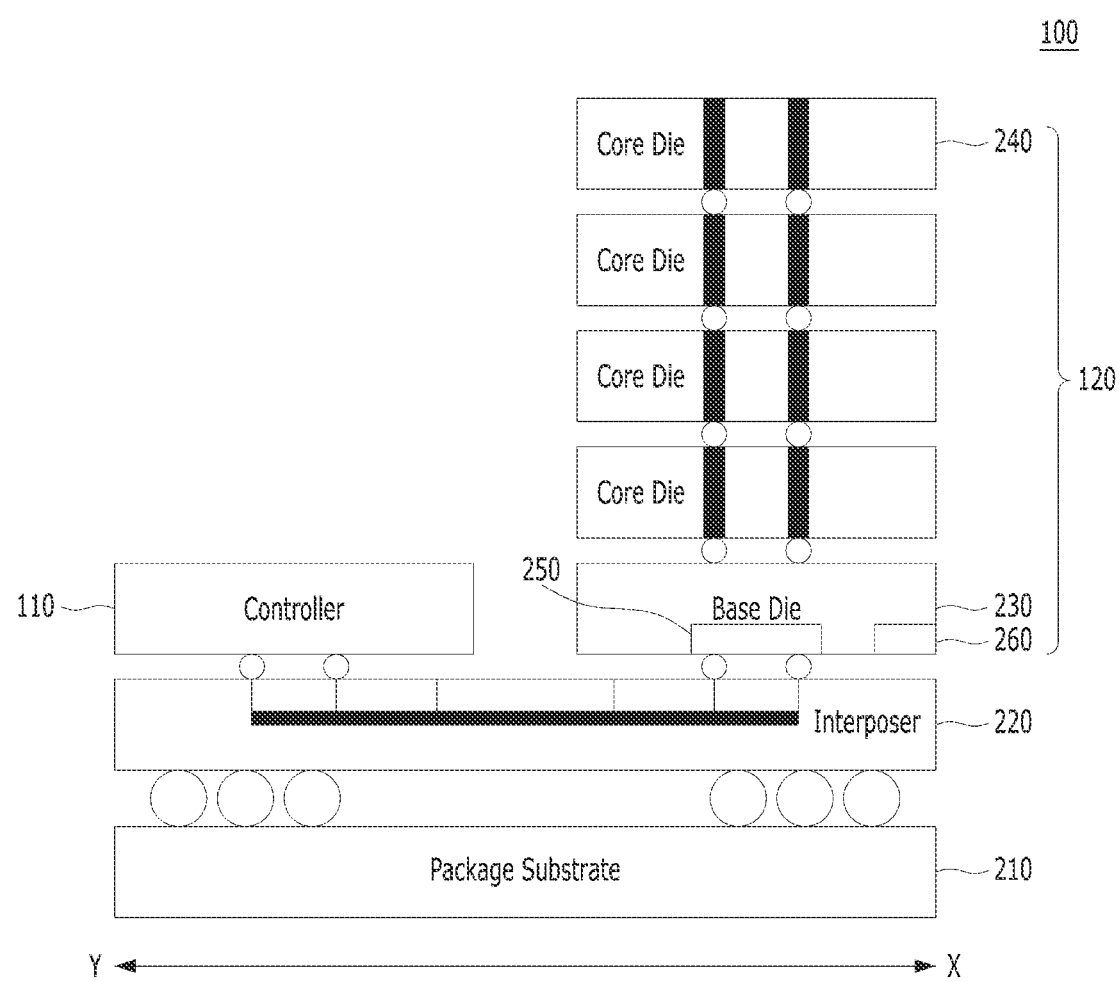
FIG. 2 is a side cross-sectional view illustrating the memory system shown in FIG. 1.

The controller 110 and the memory devices 120 to 125 may be stacked over an interposer 220 as shown, for example, in FIG. 2. The controller 110 and the memory devices 120 to 125 may communicate with each other through a signal path formed in the interposer. For communication with the controller 110, the memory devices 120 to 125 may include PHY interfaces PHY0 to PHY5 that are coupled to the interposer through micro bumps.

Since the memory devices 120 to 125 are packaged with the controller 110 in a wafer state, many tests may be performed at the wafer stage. However, since the physical size of the micro bumps is very small, it may be difficult to directly test the memory devices 120 to 125 with a probe card for testing. Also, since there are many micro bumps, e.g., approximately 1000 or more, a large number of test equipment may be required to directly apply data through the PHY interfaces PHY0 to PHY5.

Therefore, the memory devices 120 to 125 may include Direct Access (DA) interfaces DA0 to DA5 for directly accessing and testing the memory devices 120 to 125 from the exterior, respectively. The DA interfaces DA0 to DA5 may be used for testing, since the DA interfaces DA0 to DA5 include wafer test pads the physical size of which is relatively larger than the micro bumps and the number of which is less than the micro bumps.

FIG. 2 is a side cross-sectional view illustrating the memory system 100 shown in FIG. 1, which is taken along the X-Y axis of FIG. 1.

FIG. 2 illustrates a structure in which the controller 110 and the first memory device 120 among the memory devices 120 to 125 are stacked. Although not illustrated in FIG. 2, the second to sixth memory devices 121 to 125 may also have a stacked structure similar to that of the first memory device 120.

The memory system 100 may further include a package substrate 210 and an interposer 220 stacked over the package substrate 210. The interposer 220 may be stacked over the package substrate 210. In an example, the interposer 220 may be coupled to the package substrate 210 through electrical connection means, such as a bump ball, a ball grid array, and the like. The controller 110 and the first memory device 120 may also be stacked over the interposer 220. The controller 110 and the first memory device 120 may be electrically connected to the interposer 220 through micro bumps.

The first memory device 120 may include a plurality of integrated circuit chips 230 and 240 that are stacked on one other. The integrated circuit chips 230 and 240 may be electrically connected via a through silicon via (TSV) and a micro bump that are formed penetrating the inside vertically to transfer and receive signals.

The integrated circuit chips 230 and 240 may include a base die 230 and a number of core dies 240. The core die 240 may be provided with a memory cell array for storing data, and a data storage space such as a memory register. Circuits for transferring signals between the core die 240 and the controller 110 may be disposed in the base die 230.

For example, the first memory device 120 may communicate with the controller 110 through a PHY interface 250 coupled to the micro bumps. The PHY interface 250 may include a plurality of bump pads. Also, the first memory device 120 may be directly accessed and tested from the exterior through a DA interface 260 formed of a wafer test pad.

When data are inputted through the wafer test pad during a test operation, the input data may be copied into the bump pads. For example, one wafer test pad corresponding to 128 bump pads may be used for a test operation. The copied data may be written into memory cells included in the core die 240. Since the write operation is a background operation for the entire test operation, it may be performed at a relatively low speed to stably perform a test operation.

Then, data written into the memory cells may be read, and then fed back through the bump pads to be written back into the memory cells. That is, the test operation may be performed by looping the data stored in the memory cells back through read and write paths. The test operation may further include compressing and multiplexing operations and may be checked out as a pass/failure operation through the wafer test pad.

This loop-back test may be performed at a relatively high speed, for example, at the same speed as a normal operation and performed through the same path as that of the normal operation. Therefore, although data are not directly applied to the bump pads, the loop-back test may be able to test not only the bump pads but also the circuits on the read and write paths.

Figure 3:
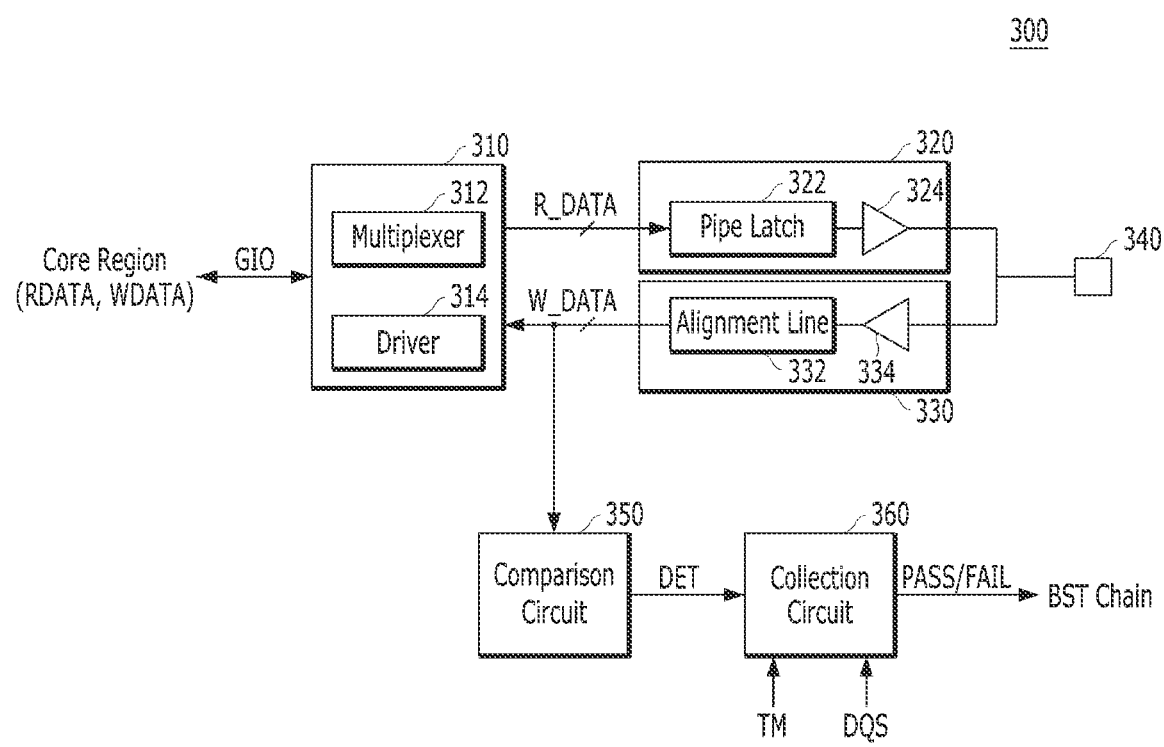
FIG. 3 is a block diagram illustrating a memory device in accordance with an embodiment of the present invention.

FIG. 3 is a block diagram illustrating a memory device 300 in accordance with an embodiment of the present invention.

The memory device 300 may include a plurality of memory cells (not shown) in a core region, and may include input/output circuits for reading/writing data of the memory cells in a peripheral region. FIG. 3 shows a part of the peripheral region of the memory device 300. The memory device 300 may include a global input/output line (GIO), GIO driving circuit 310, an output data alignment circuit 320, an input data alignment circuit 330, an input/output pad 340, a comparison circuit 350, and a collection circuit 360.

As described above, during a test operation, data outputted to the wafer test pad may be copied and stored in the memory cells included in the core region. The data RDATA read from the memory cells may be transferred to the GIO driving circuit 310 through a global input/output line GIO.

The GIO driving circuit 310 may transfer the read data RDATA transferred through the global input/output line GIO to a data output line. Also, the GIO driving circuit 310 may transfer data fed back to the data input line as write data WDATA through the global input/output line GIO.

The GIO driving circuit 310 may include a multiplexer 312 and a driver 314. During a read operation, the multiplexer 312 may transfer, as read path data R_DATA, the read data RDATA transferred through the global input/output line GIO. During a write operation, the driver 312 may drive the global input/output line GIO based on write path data W_DATA. The read path data R_DATA and the write path data W_DATA transferred and received through the data input/output path may include parallel data.

The output data alignment circuit 320 may convert the read path data R_DATA transferred in parallel to serial data and output the serial data. The output data alignment circuit 320 may include a pipe latch 322 and an output buffer 324. The pipe latch 322 may convert the read path data R_DATA into serial data. The output buffer 324 may buffer the serial data transferred from the pipe latch 322 and output the buffered serial data to the input/output pad 340.

The input data alignment circuit 330 may convert the data inputted in series through the input/output pad 340 into parallel data and transfer the parallel data as the write path data W_DATA. The input data alignment circuit 330 may include an alignment line 332 and an input buffer 334. The input buffer 334 may feed back the data outputted to the input/output pad 340 by the output buffer 324 and output the data to the alignment line 332. The alignment line 332 may convert the serial data outputted from the input buffer 334 into parallel data and transfer the parallel data as the write path data W_DATA.

During a test operation, the data RDATA read from the memory cells may be looped back to the memory cells through an input/output path and the input/output pad 340, to be written in the memory cells. The memory device 300 may compare the read data RDATA and the write data WDATA with each other, and check whether the memory cells, the circuits on the data path, or the input/output pads are defective or not based on whether the read data RDATA and the write data WDATA coincide or not.

For this series of operations of a test operation, the memory device 300 may have to repeatedly perform a read operation and a write operation. In order to loop the data, which is outputted to the input/output pad 340, back to the core region through a method of reading data from the core region and writing the data back into the core region, a read command and a write command may have to be inputted to the memory devices 300 at predetermined intervals in consideration of a read latency and a write latency.

Meanwhile, when a read operation according to a burst length is performed in the memory device 300, power noise-related defects may occur in a circuit such as the pipe latch 322 on the data output path. In order to detect such defects through a test operation, the memory device 300 may need to perform a read operation repeatedly. However, since the loop-back test of the memory device 300 includes a series of read operations and write operations, it may be difficult to repeatedly perform a read operation.

The input data alignment circuit 330 of the memory device 300 may parallelize the data inputted to the input/output pad 340 in response to a write data strobe signal. During the test operation, the write data strobe signal may be inputted through the wafer test pad or a read data strobe signal may be fed back and used.

Accordingly, during the test operation the memory device 300 may output the read data RDATA to the input/output pad 340 in response to a read command, and then feed back the read data RDATA to generate the write path data W_DATA even without a write command. The memory device 300 may repeatedly perform the read operation without limiting the number of times that the read operation is performed to generate the write path data W_DATA accordingly.

The comparison circuit 350 according to the embodiment of the present invention may compare the write path data W_DATA transferred in parallel according to the burst length, that is, a plurality of data bits transferred in parallel with each other and output a detection signal DET. Since a read operation is repeatedly performed in the memory device 300, the comparison circuit 350 may sequentially output a plurality of detection signals DET. When the write path data W_DATA are compared and it turns out that all of the data are at the same logic level, the comparison result of the comparison circuit 350 may be a pass and the detection signal DET may be outputted at a logic high level H. When the write path data W_DATA are compared and it turns out that at least one of the data is at a different logic level, the comparison result of the comparison circuit 350 may be a failure and the detection signal DET may be outputted at a logic low level L.

The collection circuit 360 may collect the detection signals DET according to a test mode signal TM and a data strobe signal DQS, and then transfer the collected result (PASS/FAIL) to a boundary scan test (BST) chain. When at least one among the detection signals DET sequentially outputted from the comparison circuit 350 is a failure, that is, at least one among the detection signals DET is at a logic low level L, the collection circuit 360 may output the collected result as a failure.

The BST chain may include a plurality of shift registers respectively corresponding to the input/output pads of the memory device 300. The BST chain may store the collected results corresponding to the input/output pads, shift the stored results during a boundary scan test, and output the shifted results to the wafer test pad. In this way, it is possible to detect a pad having a defect among the input/output pads of the memory device 300 based on the results shifted and outputted to the wafer test pad. The BST chain may be a structure for a boundary scan test of the memory device 300, and a detailed description on it will be omitted herein.

Figure 4:
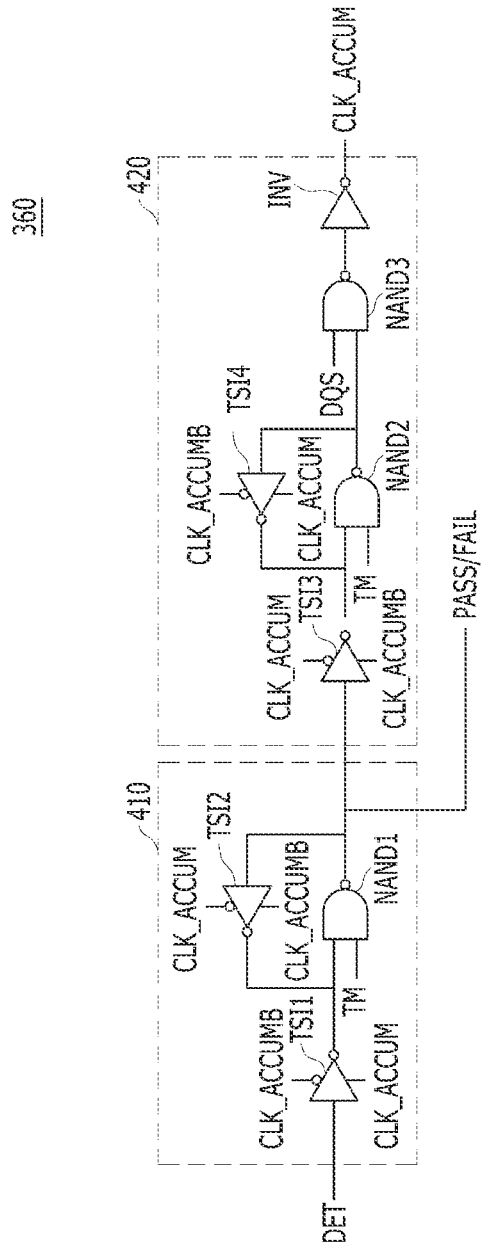
FIG. 4 is a schematic diagram illustrating a collection circuit shown in FIG. 3.

FIG. 4 is a schematic diagram illustrating the collection circuit 360 shown in FIG. 3.

Referring to FIG. 4, the collection circuit 360 may include a result output circuit 410 and a clock generator 420.

The result output circuit 410 may include a first three-phase-inverter TSI1, a second three-phase-inverter TSI2, and a first NAND gate NAND1. When the test mode signal TM is activated during a test operation, the result output circuit 410 may latch the detection signal DET in response to a clock signal CLK_ACCUM and output the latched value as the collected result (PASS/FAIL).

The clock generator 420 may include a third three-phase-inverter TSI3, a fourth three-phase-inverter TSI4, a second NAND gate NAND2, a third NAND gate NAND3, and an inverter INV. When the test mode signal TM is activated during a test operation, the clock generator 420 may latch the collected result (PASS/FAIL) in response to the clock signal CLK_ACCUM, and may synchronize the latched value with the data strobe signal DQS to output the clock signal CLK_ACCUM.

When the test mode signal TM is activated and the detection signal DET is at a logic high level H, the result output circuit 410 may output the collected result (PASS) of a logic high level H in response to the clock signal CLK_ACCUM. Accordingly, the clock generator 420 may also latch a value of a logic high level H in response to the clock signal CLK_ACCUM, and may synchronize the latched value with the data strobe signal DQS to output the clock signal CLK_ACCUM.

Alternatively, when the test mode signal TM is activated and the detection signal DET is at a logic low level L, the result output circuit 410 may output the collected result (FAIL) of a logic low level L in response to the clock signal CLK_ACCUM. The clock generator 420 may also latch a value of a logic low level L in response to the clock signal CLK_ACCUM, and the clock signal CLK_ACCUM may be outputted at a logic low level L.

Since the clock signal CLK_ACCUM is outputted at a logic low level L, the collected result FAIL of the result output circuit 410 may not change even when the logic level of the detection signal DET changes. Thus, the logic level of the clock signal CLK_ACCUM may also remain unchanged. After all, when the comparison circuit 350 outputs the detection signal DET at a logic high level H and then outputs it at a logic low level L, the collection circuit 360 may output the collected result (FAIL) of a logic low level L. Even though the comparison circuit 350 outputs the detection signal DET at a logic high level H again thereafter, the collection circuit 360 may maintain the collected result (FAIL) of a logic low level L.

Figure 5:
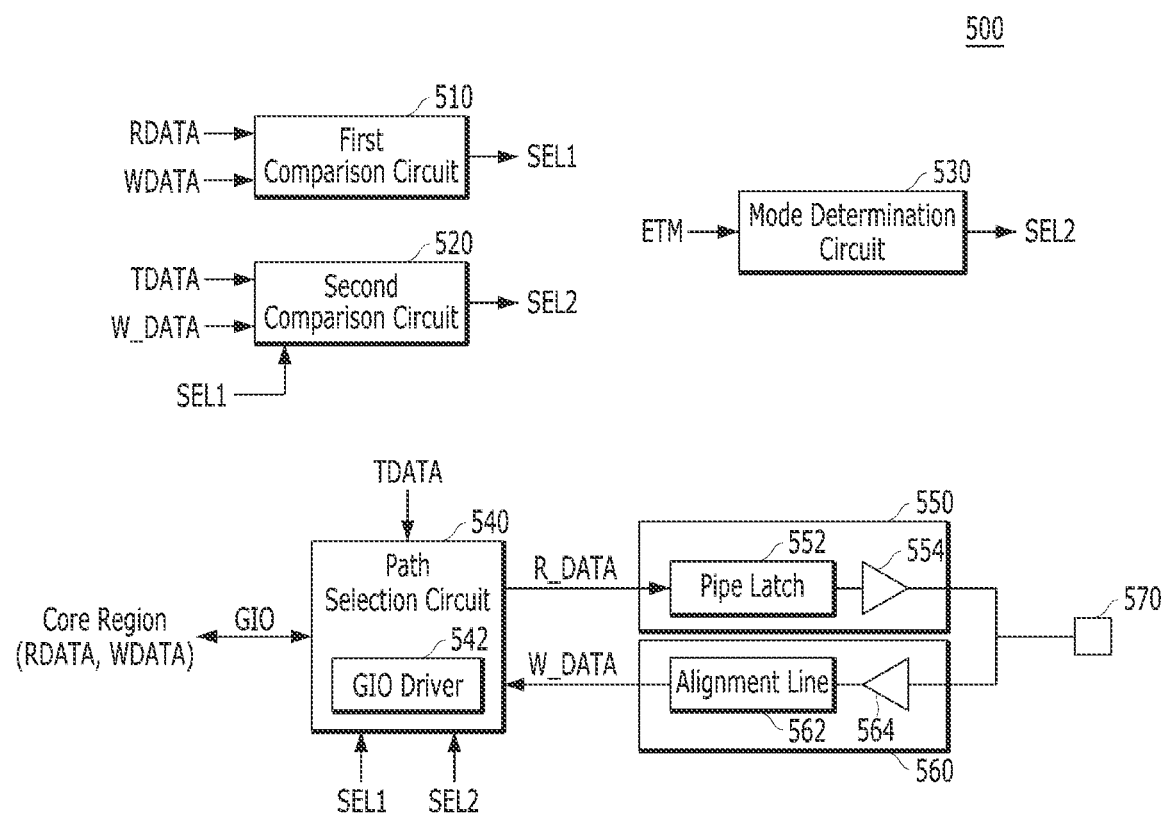
FIG. 5 is a block diagram illustrating a memory device in accordance with another embodiment of the present invention.

FIG. 5 is a block diagram illustrating a memory device 500 in accordance with an embodiment of the present invention.

FIG. 5 describes focusing on the structure that is different from that of the memory device 300 shown in FIG. 3. The memory device 500 may include a first comparison circuit 510, a second comparison circuit 520, a mode determination circuit 530, a path selection circuit 540, an output data alignment circuit 550, an input data alignment circuit 560, and an input/output pad 570.

As described above, the memory device 300 may compare the read data RDATA and the write data WDATA with each other to check whether there is a defect or not in the circuits on the data input/output path of the peripheral region as well as the memory cells of the core region. However, when a defect is detected as a result of a loop-back test operation, it may be difficult for the memory device 300 to detect where the defect has occurred among the core region and the peripheral region. According to the embodiment of the present invention, a more accurate defect analysis may be carried out by checking a whole or a part of the data path through diverse test operations.

The first comparison circuit 510 may compare the data RDATA read from the memory cells included in the core region with the data WDATA written in the memory cells. When the read data RDATA and the write data WDATA are compared with each other and it turns out that the data do not coincide, the comparison result of the first comparison circuit 510 may be a failure and the first selection signal SEL1 may be activated. When the read data RDATA and the write data WDATA are compared and it turns out that the data coincide, the comparison result of the first comparison circuit 510 may be a pass and the first selection signal SEL1 may be deactivated.

The second comparison circuit 520 may compare test data TDATA with the write path data W_DATA in response to the first selection signal SEL1. When the first selection signal SEL1 is activated, the second comparison circuit 520 may compare the test data TDATA with the write path data W_DATA. When the test data TDATA and the write path data W_DATA are compared and it turns out that the data coincide, the comparison result of the second comparison circuit 520 may be a pass and the second selection signal SEL2 may be activated. When the first selection signal SEL1 is deactivated or when the test data TDATA and the write path data W_DATA do not coincide, the comparison result of the second comparison circuit 520 may be a failure and the second selection signal SEL2 may be deactivated.

The mode determination circuit 530 may activate the second selection signal SEL2 in response to an error correction code (ECC) test mode signal ETM. The ECC test mode signal ETM may be activated when an ECC operation of the memory device 500 is performed. That is, it may be activated during a test operation to check an ECC syndrome to determine whether the ECC operation is defective or not.

The path selection circuit 540 may include a GIO driver 542. Similar to the GIO driving circuit 310 shown in FIG. 3, the GIO driver 542 may receive the read data RDATA from the memory cells through the global input/output line GIO and transfer the read path data R_DATA. Also, the GIO driver 542 may receive the write path data W_DATA and transfer the write data WDATA to the memory cells through the global input/output line GIO.

According to the embodiment of the present invention, the path selection unit 540 may transfer data that are selected among the read data RDATA and the test data TDATA in response to the first selection signal SEL1 as the read path data R_DATA. When the first selection signal SEL1 is activated, the path selection circuit 540 may transfer the test data TDATA as the read path data R_DATA. For example, the path selection circuit 540 may connect a power source voltage (VDD) line to the data output line to transfer the test data TDATA of a logic high level H as the read path data R_DATA. When the first selection signal SEL1 is deactivated, the path selection circuit 540 may transfer the read data RDATA as the read path data R_DATA.

The path selection circuit 540 may transfer the selected data among the read data RDATA and the write path data W_DATA in response to a second selection signal SEL2 as the write data WDATA. When the second selection signal SEL2 is activated, the path selection circuit 540 may feed back the read data RDATA and transfer the read data RDATA as the write data WDATA. When the second selection signal SEL2 is deactivated, the path selection circuit 540 may transfer the write path data W_DATA as the write data WDATA.

The output data alignment circuit 550 may convert the read path data R_DATA transferred in parallel into serial data and output the serial data. The output data alignment circuit 550 may include a pipe latch 552 and an output buffer 554. The pipe latch 552 may convert the read path data R_DATA into serial data. The output buffer 554 may buffer the serial data transferred from the pipe latch 552 and output them to the input/output pad 570.

The input data alignment circuit 560 may convert the data inputted in series through the input/output pad 570 into parallel data and transfer the parallel data as the write path data W_DATA. The input data alignment circuit 560 may include an alignment line 562 and an input buffer 564. The input buffer 564 may feed back the data outputted to the input/output pad 570 by the output buffer 554 and output them to the alignment line 562. The alignment line 562 may convert the serial data outputted from the input buffer 564 into parallel data and transfer the parallel data as the write path data W_DATA.

Figure 6:
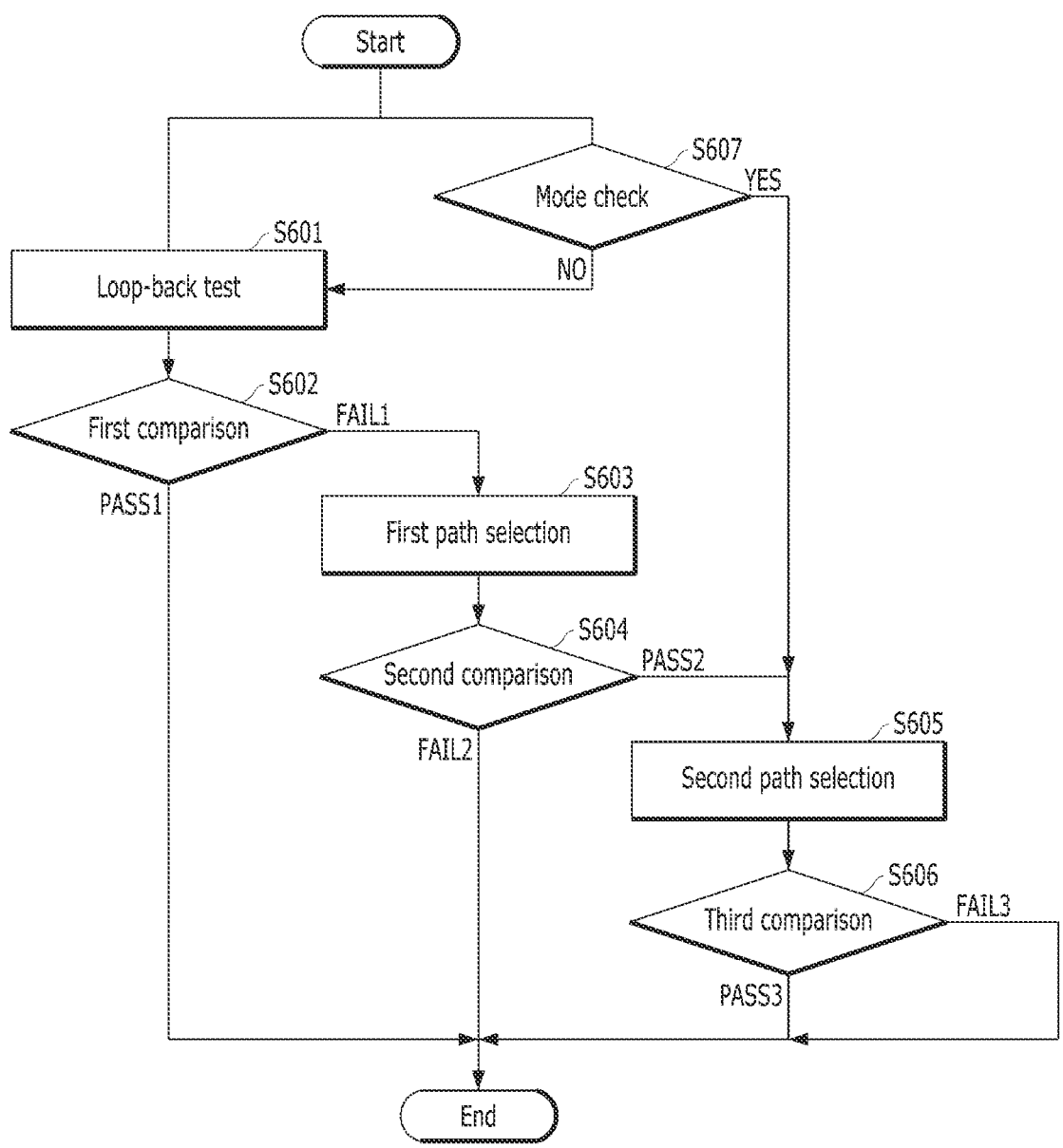
FIG. 6 is a flowchart describing a method of operating of a memory device in accordance with an embodiment of the present invention.

FIG. 6 is a flowchart describing a method for operating the memory device 500 in accordance with an embodiment of the present invention.

During a test operation, the memory device 500 may perform a loop-back test through the entire data path in operation S601. For example, data RDATA read from the memory cells may be transferred to the path selection circuit 540 through the global input/output line GIO and converted into serial data through the output data alignment circuit 550 to be outputted to the input/output pad 570. The data outputted to the input/output pad 570 may be fed back and converted back into parallel data by the input data alignment circuit 560 to be written in the memory cells through the path selection circuit 540.

The first comparison circuit 510 may determine whether it is a first pass PASS1 or a first failure FAIL1 by comparing the data RDATA read from the memory cells and the data WDATA written in the memory cells with each other in operation S602. When the read data RDATA and the written data WDATA are compared and it turns out that the data coincide, the comparison result of the first comparison circuit 510 may be confirmed as the first pass PASS1. When the read data RDATA and the written data WDATA are compared and it turns out that the data do not coincide, the comparison result of the first comparison circuit 510 may be confirmed as the first failure FAIL1.

When the comparison result of the first comparison circuit 510 is confirmed as the first failure FAIL1 (FAIL1, in the operation S602), the memory device 500 may confirm that a defect has occurred on the entire data path corresponding to the input/output pad 570. Accordingly, a partial data path corresponding to the core region or the peripheral region of the memory device 500 may be selected and a test operation may be performed.

First, the path selection circuit 540 may select a first path corresponding to the peripheral region coupled to the input/output pad 570 in operation S603. The path selection circuit 540 may transfer the test data TDATA as the read path data R_DATA, instead of the read data RDATA. The read path data R_DATA may be fed back through the input/output pad 570 to be outputted as the write path data W_DATA again.

Herein, the second comparison circuit 520 may compare the test data TDATA and the write path data W_DATA with each other to determine whether it is a second pass PASS2 or a second failure FAIL2 in operation S604. When the test data TDATA and the write path data W_DATA are compared and it turns out that the data coincide, the comparison result of the second comparison circuit 520 may be confirmed as a second pass PASS2. When the test data TDATA and the write path data W_DATA are compared and it turns out that the data do not coincide, the comparison result of the second comparison circuit 520 may be confirmed as the second failure FAIL2.

When the comparison result of the second comparison circuit 520 is confirmed as the second pass PASS2 (PASS2, in the operation S604), the memory device 500 may confirm that no defect has occurred on the first path, i.e., the data path corresponding to the peripheral region. Accordingly, the memory device 500 may feed back the read data RDATA from the core region to be written back into the memory cells. That is, the path selection circuit 540 may select a second path corresponding to the core region coupled to the memory cells in operation S605.

Although FIG. 6 shows an example in which the path selection circuit 540 selects the second path in the second pass PASS2, the path selection circuit 540 may select the second path in the second failure FAIL2. Therefore, after confirming the occurrence of a defect on the data path corresponding to the peripheral region, the memory device 500 may further check whether a defect occurs on the data path corresponding to the core region.

The path selection circuit 540 may feed back the read data RDATA and transfer the read data RDATA as the write data WDATA. Also, the first comparison circuit 510 may compare the read data RDATA with the write data WDATA to determine whether or not the read data RDATA and the write data WDATA coincide or whether it is a third pass PASS3 or a third failure FAIL3 in operation S606.

According to the embodiment of the present invention, the mode determination circuit 530 may further check a test operation mode in operation S607. In an ECC test operation mode, the data RDATA read from the memory cells may be fed back from the core region to be written into the memory cells without being be outputted to and looped back through the input/output pad 570.

In response to the ECC test mode signal ETM, the mode determination circuit 530 may check an ECC test operation mode. When it turns out as a check result of the mode determination circuit 530 that it is the ECC test operation mode (YES, in the operation S607), the memory device 500 may feed back the read data RDATA in the core region and write the fed-back data back into the memory cells. Herein, the memory device 500 may change a particular bit among the fed-back data and check an ECC syndrome by using a test pattern hold.

Accordingly, the path selection circuit 540 may select the second path corresponding to the core region coupled to the memory cells in operation S605. The first comparison circuit 510 may compare the read data RDATA and the write data WDATA with each other to determine whether or not the read data RDATA and the write data WDATA coincide or whether it is a third pass PASS3 or a third failure FAIL3 in operation S606. When it turns out as a check result of the mode determination circuit 530 that it is a loop-back test operation mode (NO, in the operation S607), the above-described operations of the operations S601 to S606 may be sequentially performed.

Figure 7:
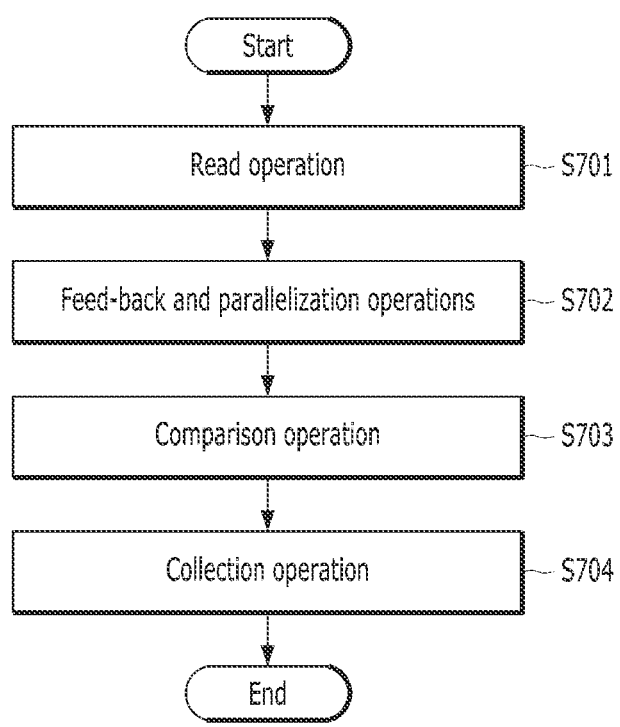
FIG. 7 is a flowchart describing a method of operating of a memory device in accordance with another embodiment of the present invention.

FIG. 7 is a flowchart describing a method for operating the memory device 300 in accordance with an embodiment of the present invention.

As a read command is applied to the memory device 300 during a test operation, a read operation may be performed in operation S701. The data RDATA read in parallel from the memory cells may be serialized through the GIO driving circuit 310 and the output data alignment circuit 320 to be outputted to the input/output pad 340.

Based on the control signals generated from a read command, the data outputted to the input/output pad 340 may be fed back and inputted without an input of a write command. The input data alignment circuit 330 may parallelize the fed back and inputted data and transfer the parallelized input data as the write path data W_DATA in operation S702.

The comparison circuit 350 and the collection circuit 360 may compare the parallelized write path data W_DATA, that is, the plurality of data bits with each other to check whether or not all of the data are at the same logic level or whether the comparison result is a pass or a failure. Herein, by repeatedly applying read commands without applying a write command, the GIO driving circuit 310, the output data alignment circuit 320, the input data alignment circuit 330, the comparison circuit 350, and the collection circuit 360 may repeatedly perform the test operations.

To be specific, the comparison circuit 350 may sequentially compare the write path data W_DATA with each other and sequentially output a plurality of detection signals DET representing the comparison result (i.e., whether all of the write path data W_DATA are at the same level or not) in operation S703. The collection circuit 360 may collect the detection signals DET and output the collected result (PASS/FAIL) to the BST chain in operation S704. When at least one among the detection signals DET represents a failure, the collection circuit 360 may output the collected result PASS/FAIL as a failure FAIL. The BST chain may shift and output the collected results corresponding to the input/output pads according to a boundary scan test operation.

According to the embodiment of the present invention, the data paths of a memory device may be selectively tested through diverse test operation modes. That is, a whole or a part of the path of the data stored in the memory device may be tested to more accurately analyze a defective area in the memory device.

Furthermore, a test may be selectively performed on a defect of a high incidence by repeatedly performing a read operation and collecting the read operation results according to the test operation modes. This makes it possible to detect power noise defects of the memory device and increase the coverage of the test operation.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
a first comparison circuit suitable for comparing read data read from a plurality of memory cells with write data written in the memory cells and outputting a comparison result;
a path selection circuit suitable for transferring selected data selected among the read data and test data as read path data based on the comparison result of the first comparison circuit;
an output data alignment circuit suitable for converting the read path data into serial data and outputting the serial data as output data;
an input data alignment circuit suitable for converting the output data into parallel data to transfer the parallel data as write path data; and
a second comparison circuit suitable for comparing the test data with the write path data based on the comparison result of the first comparison circuit and outputting a comparison result.

2. The memory device of claim 1, wherein the path selection circuit is further suitable for transferring selected data selected among the read data and the write path data as the write data based on the comparison result of the second comparison circuit.

3. The memory device of claim 1, wherein when the read data is different from the write data as the comparison result of the first comparison circuit, the path selection circuit transfers the test data as the read path data, and the second comparison circuit compares the test data with the write path data.

4. The memory device of claim 3, wherein when the test data is the same as the write path data as the comparison result of the second comparison circuit, the path selection circuit is further suitable for feeding back, as the write data, the read data to the memory cells.

5. The memory device of claim 1, wherein the path selection circuit is further suitable for receiving the read data from the memory cells through a global input/output line and transferring the read data as the read path data, receiving the write path data, and transferring the write path data as the write data to the memory cells through the global input/output line.

6. The memory device of claim 1, further comprising a mode determination circuit suitable for checking whether the memory device is in an Error Correction Code (ECC) test operation mode or not.

7. The memory device of claim 6, wherein the path selection circuit is further suitable for transferring selected data selected among the read data and the write path data as the write data based on a result of the checking of the mode determination circuit.

8. The memory device of claim 1, further comprising:
a third comparison circuit suitable for comparing a plurality of bits of the write path data with each other and outputting a detection signal; and
a collection circuit suitable for collecting the detection signal and transferring a collected detection signal to a boundary scan test chain.

9. The memory device of claim 8, wherein the third comparison circuit sequentially outputs a plurality of detection signals respectively corresponding to read operations that are repeatedly performed.

10. The memory device of claim 9, wherein when at least one among the detection signals represents a failure, the collection circuit outputs the collected result as a failure.

11. The memory device of claim 8, wherein the collection circuit includes:
a result output circuit suitable for first latching the detection signal in response to a clock signal and outputting the first latched detection signal as the collected detection signal; and
a clock generator suitable for secondly latching the collected detection signal in response to the clock signal, and synchronizing the secondly latched detection signal with a data strobe signal and outputting the clock signal.

12. A method for operating a memory device, comprising:
converting parallel read data that are read from a plurality of memory cells into serial data to be provided to an input/output pad, converting the serial data feeding back from the input/output pad back into parallel data, and writing the parallel data as write data in the memory cells;
comparing the read data and the write data with each other to determine whether a first comparison result is a pass or a failure; and
converting test data into the serial data instead of the read data, to be provided to the input/output pad, converting the serial data feeding back from the input/output pad back into the parallel data, and comparing the test data and the parallel data with each other to determine whether a second comparison result is a pass or a failure, when the first comparison result is determined as the failure.

13. The method of claim 12, further comprising, when the second comparison result is determined as the pass:
feeding back the read data as the write data to the memory cells and writing the write data into the memory cells; and
comparing the read data and the write data with each other to determine whether a third comparison result is a pass or a failure.

14. The method of claim 12, further comprising checking whether the memory device is in an Error Correction Code (ECC) test operation mode or not.

15. The method of claim 14, further comprising, when the memory device is checked in the ECC test operation mode:
feeding back the read data as the write data to the memory cells and writing the write data into the memory cells; and
comparing the read data and the write data with each other to determine whether a third comparison result is a pass or a failure.

16. A memory device comprising:
a memory core configured to store write data and provide read data;
a path selector configured to provide test data;
a first loop-back path configured to loop the read data, which is transferred from the memory core to an input/output (IO) pad, back to the memory core as first looped-back data;
a second loop-back path configured to loop the test data, which is transferred from the path selector to the IO pad, back to the path selector as second looped-back data; and
a first detector configured to detect a defect of a path between the memory core and the IO pad by comparing the write data with the first looped-back data, and detect a defect of a path between the path selector and the IO pad by comparing the test data with the second looped-back data based on the detected result of the path between the memory core and the IO Dad.

17. The memory device of claim 16, further comprising:
a third loop-back path configured to loop the read data, which is transferred from the memory core to the path selector, back to the memo core as third looped-back data; and
a second detector configured to detect a defect of a path between the memory core and the path selector by comparing the read data with the third looped-back data based on the detected result of the path between the path selector and the IO pad.

* * * * *